Jan. 12, 1965 D. P. MILLER 3,165,615
APPARATUS FOR FORMING CLEAN IRON-LEAD TELLURIDE
HIGH TEMPERATURE PRESSURE CONTACTS
Original Filed April 7, 1961 2 Sheets-Sheet 1

Donald Piguet Miller
INVENTOR
BY James O. Dixon
ATTORNEY

Donald Piguet Miller
INVENTOR
BY James O. Dixon
ATTORNEY 3,165,615

APPARATUS FOR FORMING CLEAN IRON-LEAD TELLURIDE HIGH TEMPERATURE PRESSURE CONTACTS

Donald Piguet Miller, Dallas, Tex., assignor to Texas Instruments Incorporated, Dallas, Tex., a corporation of Delaware Original application Apr. 7, 1961, Ser. No. 101,565, now Patent No. 3,093,719, dated June 11, 1963. Divided and this application July 2, 1962, Ser. No. 207,112
1 Claim. (Cl. 219—9.5)

Figure 1:
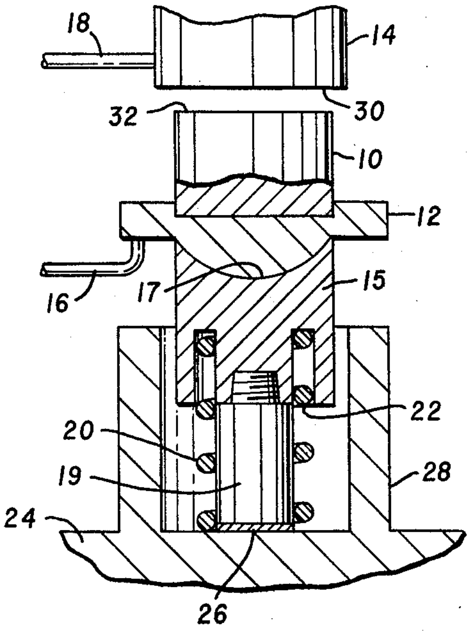

This invention relates to apparatus for forming contacts between elements of thermoelectric generators, and more particularly to an apparatus performing method of cleaning the contacting surfaces of thermocouple elements wherein at least one element is made of a thermoelectric material.

This is a divisional application of copending application Serial No. 101,565, filed April 7, 1961, now Patent No. 3,093,719 by Donald Piguet Miller for a Method of Forming Clean Iron-Lead Telluride High Temperature Pressure Contact, and assigned to the same assignee as this divisional application.

The term "thermoelectric material" as used throughout this specification and in the appended claim is to be understood as referring to those materials which are now widely used in making electrical conductors for thermoelectric generators. Examples of such materials are lead-telluride and bismuth-telluride. Additional examples of such thermoelectric materials are described in U.S. Patents Nos. 2,790,021, 2,811,569, 2,811,720 and 2,811,440 to Fritts and reference is made to these patents for a detailed description of the composition of these materials, as well as a detailed description of a fusion method for bonding metal contact electrodes to opposite ends of an electrical conductor made of one of these materials to provide spaced hot and cold junctions. Iron has proved to be very acceptable as a contact electrode for electrical conductors of thermoelectric material, and particularly for the hot junction, because it does not alloy or dissolve in thermoelectric material at temperatures below 700° C., that being well above the ordinary upper limit of operating temperatures for thermoelectric generators. On the other hand, alloying or solution between thermoelectric materials and iron contact electrodes takes place at slightly higher temperatures; therefore, bonded contacts can be formed very simply.

One widely used method of bonding metal contact electrodes to the electrical conductor is the fusion method. In accordance with this method, the contacting faces of a contact electrode and an electrical conductor of the thermoelectric material are cleaned as thoroughly as possible and pressed together. The contact electrode is then heated, preferably inductively, until a very thin layer of the electrical conductor becomes molten and fuses with the face of the contact electrode. The heating is continued for a very short interval after the elements have been pressed together, after which the assembly is allowed to cool.

In accordance with the present invention, it has been discovered that the contact specific conductivity can be increased several orders of magnitude if the face of the contact electrode is cleaned in an atmosphere of a reducing gas such as hydrogen, at high temperature, and the contacting face of the electrical conductor is also cleaned in a vacuum at a temperature sufficient to sublime a small amount of the thermoelectric material from the contacting face before the electrical conductor is pressed against the contact electrode at the plastic temperature of the thermoelectric material.

With the apparatus of the invention, all of this can be accomplished during the assembly of the elements in the following manner: positioning the electrical conductor and contact electrode with their contacting faces in closely spaced relation within an enclosed chamber having a hydrogen atmosphere and with the contact electrode heated to a high temperature; evacuating the chamber and allowing the contact electrode to heat the contacting face of the electrical conductor sufficiently by radiation to sublime a small amount of the thermoelectric material from the contacting face, and pressing the two elements together with the contact electrode at the plastic temperature of the thermoelectric material while maintaining the vacuum within the chamber.

It is one object of the invention to provide an apparatus for performing an improved method of bonding contact electrodes to electrical conductors of thermoelectric material in a manner to increase the contact specific conductivity by several orders of magnitude.

It is another object of the invention to provide apparatus which allows a more effective cleaning the contact faces of a contact electrode and an electrical conductor of thermoelectric material prior to bonding them together.

It is a further object of the invention to provide apparatus for conducting a method of cleaning the contacting faces of the above-mentioned elements in an enclosed chamber and fusion bonding them together without removing them from the chamber.

It is a still further object of the invention to provide apparatus for cleaning the contacting face of an electrical conductor of thermoelectric material by heat radiating from a contact electrode at a temperature sufficient to sublime a small amount of the thermoelectric material from the contacting face.

It is a still further object of the invention to provide apparatus for pressing the electrical conductor against the contact electrode within an evacuated chamber and after the sublimation of the small amount of thermoelectric material as described above without interrupting the vacuum within the chamber.

Figure 2:
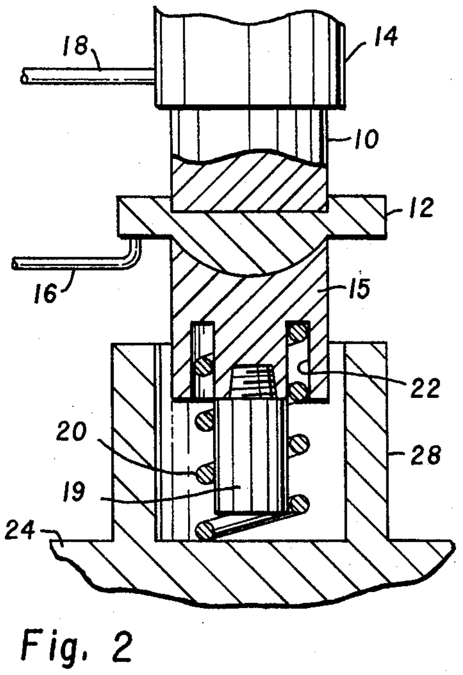
Figure 3:
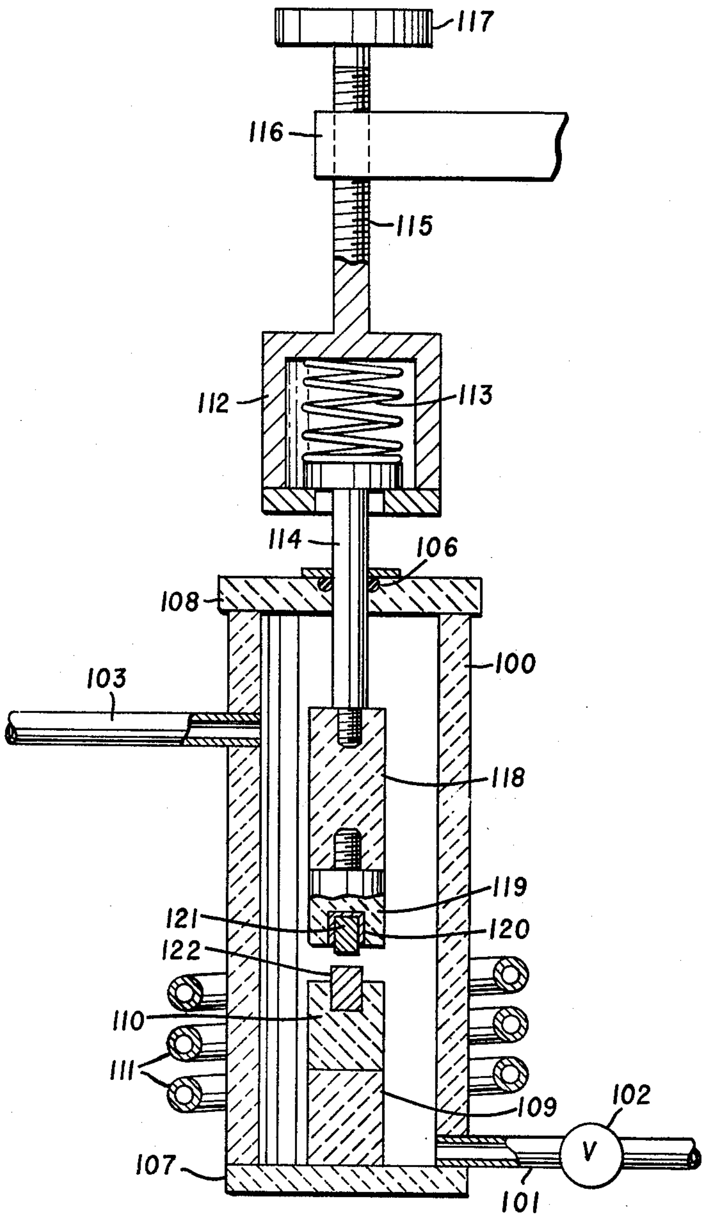

Other objects and features of novelty of the invention will be specifically pointed out or will otherwise become apparent when referring, for a better understanding of the invention, to the following description taken in conjunction with the accompanying drawings, wherein:

FIGURE 1 is a fragmentary sectional view in elevation of one embodiment of apparatus used in connection with practicing the method of the present invention; and FIGURE 2 is a view of the elements of FIGURE 1 illustrating the position they assume after the electrical conductor and upper contact electrode have been pressed together; and FIGURE 3 is a fragmentary sectional view in elevation of another embodiment of apparatus used in connection with practicing the method of the present invention.

Referring to FIGS. 1 and 2, one embodiment of apparatus useful in performing the invention is illustrated. An electrical conductor 10 of thermoelectric material is bonded to the upper surface of a contact electrode 12 to form a subassembly in closely spaced relation to a contact electrode 14, electrical leads 16 and 18 being connected to the contact electrodes 12 and 14 respectively. In the specific embodiment illustrated, the electrical conductor 10 is made of lead-telluride, the contact electrode 12 is made of copper, and the contact electrode 14 is made of iron.

The contact electrode 12 is supported on an adaptor 15 having a concave upper surface 17 which conforms to the under side of the contact electrode 12. A piston 19, preferably made of copper, projects downwardly from and is threadably connected to the bottom of the adaptor 15 and a coil spring 20 is disposed thereabout under compression with the upper end thereof fiting within an annular groove 22 in the adaptor and the lower end thereof engaging the surface of a supporting wall 24. The lower end of the piston 19 is soldered to the surface of the supporting wall by a layer 26 of a suitable low temperature solder such as, for example, Wood's metal or indium, so as to maintain contacting faces 30 and 32 of the contact electrode 14 and electrical conductor 10, respectively, in spaced relation despite the biasing force provided by the compressed spring 20. An annular wall 28 projects upwardly from the supporting wall 24 in position to encircle and guide the lower portion of the adaptor 15.

In accordance with the method of the invention, the above apparatus is positioned within an enclosed chamber (not shown) having a hydrogen partial atmosphere of approximately 10 mm. of Hg pressure, for example, and the iron contact electrode 14 is heated to approximately 1000° C., preferably inductively, to clean the contacting face 30 of the contact electrode. The chamber is then evacuated and the heat radiating from the iron contact electrode is utilized to clean the contacting face 32 of the electrical conductor 10 by radiation, the temperature of the iron contact electrode being maintained at or near the aforementioned 1000° C. to provide sufficient heat to sublime a small amount of lead-telluride from the contact face 32. At this point it is noted that the exact temperature of the iron contact electrode 14 will determine the necessary spacing beween the contacting faces 30 and 32 to accomplish the sublimation of the small amount of lead-telluride as described above.

During this procedure, the supporting wall 24 and the annular wall 28 are maintained, preferably inductively, at a temperature lower than the melting point of the solder layer 26 to prevent the solder layer from melting. After the aforementioned small amount of lead telluride has been sublimated from the contacting face 32, the temperature of iron contact electrode 14 is lowered to 650°–700° C., and the temperatures of supporting wall 24 and annular wall 28 are raised sufficiently high to melt the solder layer 26 to enable the compressed spring 20 to drive the electrical conductor 10 into excellent clean contact with the contacting face 30 of the contact electrode as shown in FIG. 2. The contact electrode 14 is maintained at the aforementioned temperature, the chamber still being maintained under vacuum, until a very thin layer of the contacting face 32 becomes plastic and flows onto the contacting face 30. Accordingly, the time of heating is only a matter of a few seconds, after which the assembly is allowed to cool so that the electrical conductor with the contact electrodes bonded to the ends thereof can be removed from the chamber.

With this method the contact faces 30 and 32 are more effectively cleaned, in a simple manner, and the resulting bond between the faces is far superior. All of this is accomplished without removing the elements from the chamber due to the unique method of releasing the adaptor 15 by merely raising the temperature of the supporting wall 24 to melt the low temperature solder layer 26.

FIGURE 3 illustrates another embodiment of the apparatus for practicing the method of the present invention. This apparatus consists of a housing 100 having an exhaust outlet 101. Also, a valve 102 is provided so that the exhaust outlet 101 may be opened and closed. An inlet 103 is also provided in housing 100 to allow hydrogen and helium gas streams to be introduced into housing 100. Housing 100 sits on vacuum sealing base plate 107 which mounts a holder 109 for RF heating element 110 which is heated by RF coil 111. A top plate 108 completes the evacuatable apparatus. Positioned above housing 100 is a spring contact housing 112. In the housing 112 is a spring 113 which applies spring tension to a T-rod 114 which extends through top plate 108 and is vacuum sealed by seal 106. The contact housing 112 has a drive screw 115 threadedly engaging plate 116 which is spacially fixed with respect to housing 100. A drive wheel 117 is provided to turn screw 115. Rod 114 is threadedly attached to ceramic holder 118 which carries a threaded ceramic body 119. As illustrated ceramic holder 119 has a lead telluride thermoelectric element 121 supported therein with a mica sleeve 120 to separate the lead telluride element 121 from the ceramic holder 119.

As depicted, RF heating element 110 carries the iron shoe 122 which is to be attached to lead telluride element 121. When it is desired to apply the spring force of spring 113 between iron shoe 122 and lead telluride element 121, wheel 117 is rotated to drive screw 115 in member 116 such that spring 113 is compressed forcing shaft 114 to move downwardly through seal 106 in top plate 108 causing engagement between lead telluride element 121 and iron shoe 122.

Numerous contacts utilizing the apparatus depicted in FIGURE 3 have been made in accordance with the following procedure. An iron shoe with a flat contacting surface was washed in acetone to remove oils and then placed in warm nitric acid (1 to 1 ratio with water) and allowed to etch for about 1 minute or less. The etching was slowed by adding water over a period of several minutes until very little etching occurred. The iron shoe was removed and washed in water and in HCl to remove oxides and nitrates and then in water. The iron shoe was further washed in deionized water and dried in air. The iron shoe was then mounted in carbon heating element 110. A lead telluride sample previously cut with a diamond saw was made smooth with fine grit paper and then polished on a lapping wheel (such cleaning and polishing techniques are generally used in the semiconductor manufacturing processes). After lapping, the lead telluride was washed with water and rinsed with deionized water to remove any free ions of contaminating material. The sample of lead telluride was then dried and mounted in the ceramic holder 119. The contacting apparatus housing 100 was purged with $H_2$ and then evacuated leaving a low pressure of hydrogen, perhaps 10 microns. RF coils 111 were then activated to heat carbon heater 110 until iron shoe 122 reached a temperature of about 1000° C. At this time the lead telluride sample was in a relatively cool region of the housing 100. The temperature of the iron shoe 122 was then decreased to about 700° C. at which time the lead telluride sample was lowered until it was in the proximity of the hot iron shoe. The heat radiated from the iron shoe was sufficient to cause the lead telluride sample 121 to sublime and become plastic. After the near surface of the lead telluride became plastic it was slowly lowered into contact with the iron shoe until the maximum pressure of contacting spring 113 was achieved. The spring pressure was sufficient to obtain clean forcing contact between lead telluride sample and the iron shoe. To insure that sufficient contacting pressure was obtained, the $H_2$ supply was stopped and He added until 35 p.s.i. was obtained in the housing 100. The temperature of the entire unit was maintained at 700° C. for one hour after which the RF heating was shut off and the sample allowed to cool to room temperature. After the sample had reached room temperature, the helium pressure was released and the contacting spring carefully released. The iron sample attached to the lead telluride was raised completely out of the carbon heating element 110 and then the entire unit was removed from the ceramic holder 120.

Several samples of the lead telluride pressure contact were made from both N and P-type conductivity materials. The specific resistance of the contacts was obtained by flowing a current through the sample of a given area cross section and determining the specific resistance and resistivity of the lead telluride by a probe technique to obtain voltage drops at the different areas. Table I below lists the data obtained.

*Table I*

| Material | Contact Specific Resistance, Ohm-Cm.$^2$ | Lead Telluride Resistivity, Ohm-Cm. | E.M.F. Drop, Volts | Area | Current, Amps |
|---|---|---|---|---|---|
| N-type | $4.37\times10^{-5}$ | $3.14\times10^{-4}$ | $1.15\times10^{-4}$ | .182 | .4789 |
| N-type | $2.09\times10^{-5}$ | $1.45\times10^{-4}$ | $9.5\times10^{-5}$ | .105 | .4774 |
| N-type | $4.84\times10^{-5}$ | $2.33\times10^{-4}$ | $5.4\times10^{-5}$ | .427 | .4762 |
| N-type | $2.24\times10^{-5}$ | $2.56\times10^{-4}$ | $2.5\times10^{-5}$ | .427 | .4770 |
| P-type | $2.60\times10^{-4}$ | $2.31\times10^{-3}$ | $4.5\times10^{-4}$ | .278 | .4728 |
| P-type | $6.81\times10^{-5}$ | $5.54\times10^{-4}$ | $9.5\times10^{-4}$ | .3395 | 4.7338 |

Although it will be apparent that the embodiments of the invention herein disclosed are well calculated to fulfill the objects of the invention, it will be appreciated that the invention is susceptible to modification, variation and change without departing from the proper scope or fair meaning of the subjoined claim.

What is claimed is:

Apparatus for thermally bonding an electrical conductor to a contact electrode within a chamber to form a thermocouple element apparatus in said chamber comprising a supporting wall, a contact electrode positioned above said wall, an adaptor positioned beneath said contact electrode, an electrical conductor of thermoelectric material supported on the upper end of said adaptor, spring means positioned between said adaptor and supporting wall to normally bias the electrical conductor into engagement with the contact electrode, and low temperature solder means for bonding said adaptor to the supporting wall in a retracted position to maintain the electrical conductor in spaced relation to the contact electrode and place said spring means under compression, whereby when said low temperature solder means is melted by heat supplied through the supporting wall the bond between the adaptor and supporting wall will be broken and the compressed spring means will bias the electrical conductor into engagement with the contact electrode.

References Cited in the file of this patent

UNITED STATES PATENTS

| | | |
|---|---|---|
| 2,101,156 | Payne | Dec. 7, 1937 |
| 2,326,296 | Harrison et al. | Aug. 10, 1943 |
| 2,705,768 | Kleimack et al. | Apr. 5, 1955 |